(12) United States Patent
Gu

(10) Patent No.: US 6,180,529 B1
(45) Date of Patent: Jan. 30, 2001

(54) METHOD OF MAKING AN IMAGE SENSOR OR LCD INCLUDING SWITCHING PIN DIODES

(75) Inventor: Tieer Gu, Troy, MI (US)

(73) Assignee: OIS Optical Imaging Systems, Inc., Northville, MI (US)

(*) Notice: Under 35 U.S.C. 154(b), the term of this patent shall be extended for 0 days.

(21) Appl. No.: 09/014,379

(22) Filed: Jan. 27, 1998

(51) Int. Cl.[7] .............................................. H01L 21/3065
(52) U.S. Cl. ......................... 438/706; 438/710; 438/712; 438/720; 438/723
(58) Field of Search ................................ 438/689, 690, 438/693, 691, 692, 702, 703, 706, 710, 712, 27, 28, 30

(56) References Cited

U.S. PATENT DOCUMENTS

| | | | |
|---|---|---|---|
| 4,672,454 | 6/1987 | Cannella et al. | 356/213.11 |
| 4,728,802 | 3/1988 | Baron | 250/578 |
| 4,731,610 | 3/1988 | Baron et al. | 340/784 |
| 4,868,616 | 9/1989 | Johnson et al. | 357/17 |
| 4,929,569 * | 5/1990 | Yaniv et al. | 437/51 |
| 5,003,356 | 3/1991 | Wakai et al. | 357/4 |
| 5,396,072 | 3/1995 | Schiebel et al. | 250/370.89 |
| 5,426,292 * | 6/1995 | Bird et al. | 250/208.1 |
| 5,498,880 | 3/1996 | Lee et al. | 250/580 |
| 5,641,974 | 6/1997 | den Boer et al. | 257/59 |
| 5,827,755 * | 10/1998 | Yonehara et al. | 438/30 |

* cited by examiner

Primary Examiner—Benjamin L. Utech
Assistant Examiner—Lan Vinh
(74) Attorney, Agent, or Firm—Laff, Whitesel & Saret, Ltd.

(57) ABSTRACT

A method of manufacturing a PIN (positive-intrinsic-negative) diode structure includes depositing an insulation or dielectric layer over the bottom PIN diode electrodes, prior to depositing the PIN semiconductor layers. The insulation layer results in a PIN diode structure with reduced leakage current, reduced RIE (reactive ion etching) chamber contamination, the reduction or elimination of post RIE processing, improved yields, and/or expands the potential materials that may be used for the bottom electrode. A corresponding PIN diode structure is also disclosed. The resulting PIN diode structures may be used in, for example, LCD (liquid crystal display) and solid state imager applications.

19 Claims, 3 Drawing Sheets

METHOD OF MAKING AN IMAGE SENSOR OR LCD INCLUDING SWITCHING PIN DIODES

This invention relates to a method of making an image sensor or a liquid crystal display (LCD), wherein amorphous silicon PIN diodes are utilized as switching/addressing elements and/or light sensing elements. More particulary, this invention relates to a method of making a diode structure, useable in both image sensor and LCD applications, wherein a passivation layer (e.g. silicon nitride or silicon oxide) is applied over the bottom electrode of a PIN diode prior to the formation of the positive (e.g. boron doped), intrinsic, and negative (e.g. phosphorous doped) layers. This additional passivation layer (i) expands the types of metals useable as the bottom electrode, (ii) results in a low leakage PIN (same as NIP) diode, (iii) lessens chamber contamination in reactive ion etching (RIE) tools thereby improving machine uptime, (iv) eliminates the need for post-RIE treatment processes, and (v) results in improved crossover yields.

BACKGROUND OF THE INVENTION

Electronic matrix arrays find considerable application in image sensors (e.g. X-ray image sensors) and active matrix liquid crystal displays (AMLCDs). Such devices generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in liquid crystal displays are liquid crystal inclusive pixels, while in image sensors these elements are storage capacitors or photodiodes. Arrays of these elements are formed on a substrate in both LCDs and image sensors. See, for example, U.S. Patent Nos. 5,641,974 and 4,728,802 the disclosures of which are hereby incorporated herein by reference.

Typically, a switching or isolation device such as a diode or thin-film transistor (TFT) is associated with each array element. The isolation devices permit the individual elements to be selectively addressed by the application of suitable potentials between respective pairs of the X and Y address lines. Thus, the diodes or TFTs act as switching elements for energizing or otherwise addressing corresponding pixel electrodes in LCD applications, and for addressing storage capacitors or photodiodes in imager applications.

The use of PIN (same as NIP) diodes is known. For example, see U.S. Pat. Nos. 4,728,802 and 4,868,616, the disclosures of which is incorporated herein by reference, in which PIN diodes are provided in each of an imager and a liquid crystal display, respectively. However, it is very difficult to control leakage current of PIN diodes and difficult to obtain a robust silicon (Si) etching process with known a—Si (amorphous silicon) based n+/i/p+ PIN/NIP diodes.

Prior art FIGS. 1 and 2 disclose a known method for making PIN diodes in a sensor application. As shown in FIG. 1, substrate 1 is provided. Then, bottom diode metal 3 is deposited on substrate 1. This bottom metal 3 is then patterned and etched to form the two portions 3 illustrated in FIGS. 1 and 2. Thereafter, the n+, intrinsic (i), and p+ a—Si layers are deposited over portions 3 on substrate 1. Prior to patterning or etching these semiconductor layers, an indium-tin-oxide (ITO) layer is deposited over the p+ layer. After these semiconductor and ITO layers are deposited, they are patterned and etched to form the two diodes illustrated in FIG. 2. The ITO is first patterned and etched, and thereafter the silicon PIN layers are dry etched. The result is the FIG. 2 structure including switching PIN diode 5 and light sensitive photodiode 7.

As shown in FIG. 2, switching diode 5 includes bottom metal electrode 3, n+ a—Si layer 9, intrinsic a—Si layer 11, p+ a—Si layer 13, and overlying ITO top electrode layer 15. Photodiode 7 includes each of these same layers deposited over larger metal layer portion 3. The image sensor of FIG. 2 functions in a known manner.

Unfortunately, the FIGS. 1–2 method/structure suffers from a number of problems, three of which are described below. First, because silicon (PIN material) is etched in either Cl and/or F based plasmas, which have poor etch selectivity with regard to metals such as Mo, Ti, Ta, and the like, this limits the number of metals which may be used as bottom electrode layer 3. This problem limits the instant applicants to the use of Cr for bottom metal electrode layer 3. This, of course, is undesirable.

Second, when $CF_4$, $CHF_3$ based plasmas are used for etching Si, PIN (or NIP) diodes tend to leave polymer residue film on diode sidewalls and glass substrate, and thus post-RIE (reactive ion etching) chemical treatment is typically needed to clean the sidewall(s) of the diodes and glass substrate. This of course is undesirable, as post-RIE treatments are expensive, and difficult to perform satisfactorily.

Third, when $Cl_2$ plasma is used to etch the silicon, low leakage current may be obtained. However, unfortunately the RIE process chamber becomes severely contaminated by non-volatile metal chloride generated during the overetch process. This contamination is seen in cases of Mo, Cr, and Ta when used as the bottom metal electrode layer 3. Such contamination can slow the etch rate and induce non-uniformities and therefore increases downtime of the manufacturing process, and leads to increased costs.

It is apparent from the above that there exists a need in the art for an improved PIN diode design, and method of manufacturing same, which (i) results in PIN diodes having low leakage current characteristics; (ii) enables a large variety of metals such as Mo, Ti, Ta, and the like to be used as the bottom electrode layer in the PIN diode; (iii) eliminates the need for Cr target installation and Cr etching development in a wet bench; (iv) substantially reduces chamber contamination and thus improves machine uptime; (v) eliminates post RIE treatment processes; and/or (vi) results in better crossover yield because there will be two insulating layers (e.g. silicon nitride layers) between column and row lines.

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing a method of making a PIN diode structure, the method comprising the steps of:

providing a substrate;

providing a bottom electrode on the substrate;

depositing a substantially continuous insulation layer over the bottom electrode;

forming a contact hole in the substantially continuous insulation layer at a location where a PIN diode is to be formed;

depositing a n+ doped semiconductor layer, and intrinsic semiconductor layer, and a p+ doped semiconductor layer on the substrate over the bottom electrode so that one of the p+ doped semiconductor layer and the n+ doped semiconductor layer contacts the bottom electrode through the contact hole;

providing a top electrode layer on the substrate over the p+ doped, n+ doped, and intrinsic semiconductor layers;

patterning the top electrode layer to form a top electrode for the PIN diode; and etching each of the p+ doped semiconductor layer, the n+ doped semiconductor layer, and the instrinsic semiconductor layer in order to form the PIN diode at the location on the substrate where the contact hole was formed in the insulation layer.

PIN diode structures according to this invention may be used in either X-ray imagers or in liquid crystal displays.

This invention will now be described with reference to certain embodiments thereof as illustrated in the following drawings.

IN THE DRAWINGS

DETAILED DESCRIPTION OF CERTAIN EMBODIMENTS OF THIS INVENTION

Figure 1:
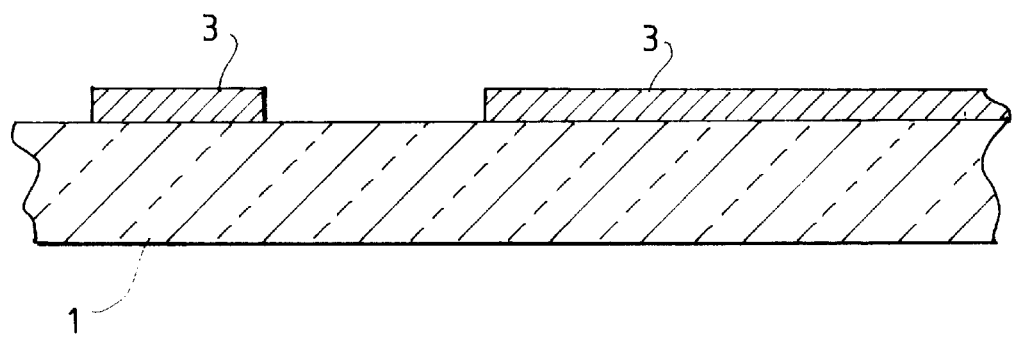
FIG. 1 is a side cross sectional view of a prior art method of making a PIN diode, this figure showing the bottom PIN diode electrode deposited and patterned on a substrate.
Figure 2:
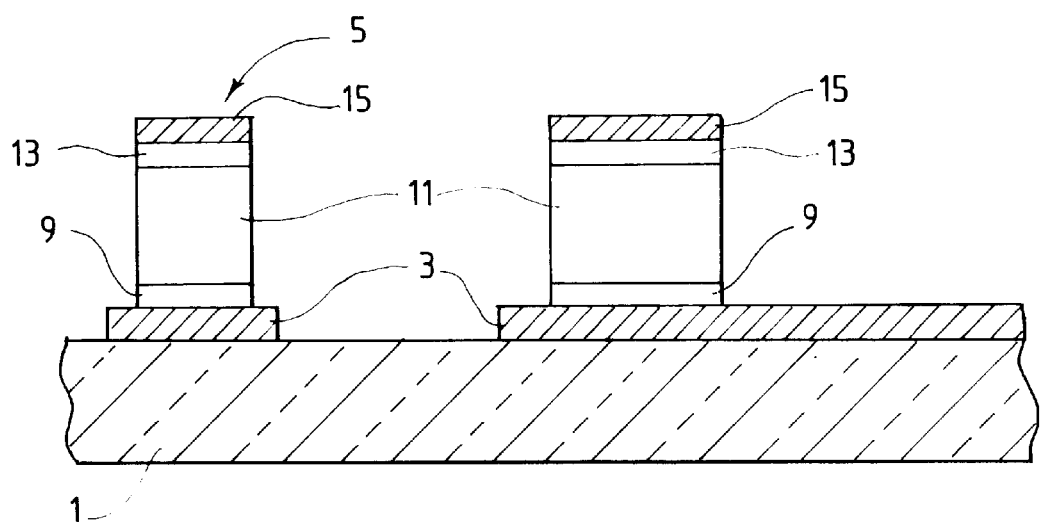
FIG. 2 is a side cross sectional view of the FIG. 1 prior art method of making a PIN diode, this figure showing PIN diodes formed on the substrate.

Referring now more particularly to the accompanying drawings in which like reference numerals indicate like parts throughout the several views.

Figure 3A:
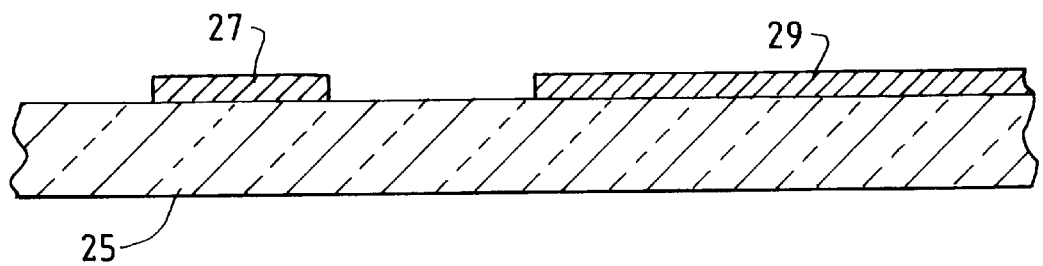
FIG. 3(a) is a side cross sectional view of a method of making a PIN diode according to an embodiment of this invention, this Figure illustrating the bottom PIN diode electrode deposited and formed on the substrate.
Figure 3B:
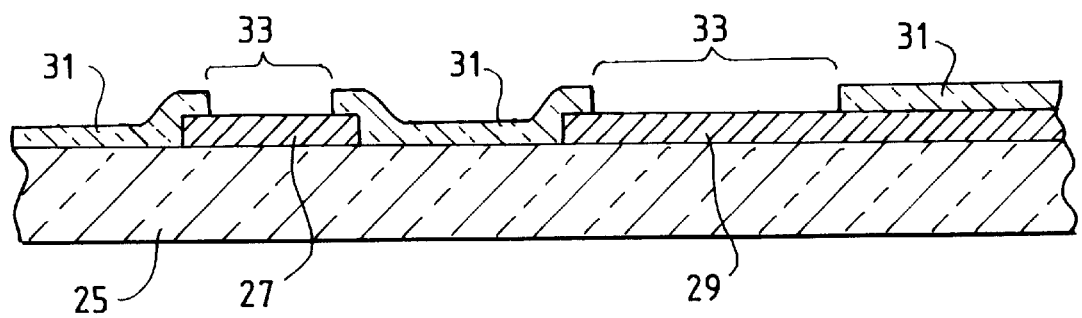
FIG. 3(b) is a side cross sectional view of a method of making a PIN diode according to an embodiment of this invention, this Figure illustrating a passivation layer formed over top of the bottom PIN diode electrode on the substrate.
Figure 3C:
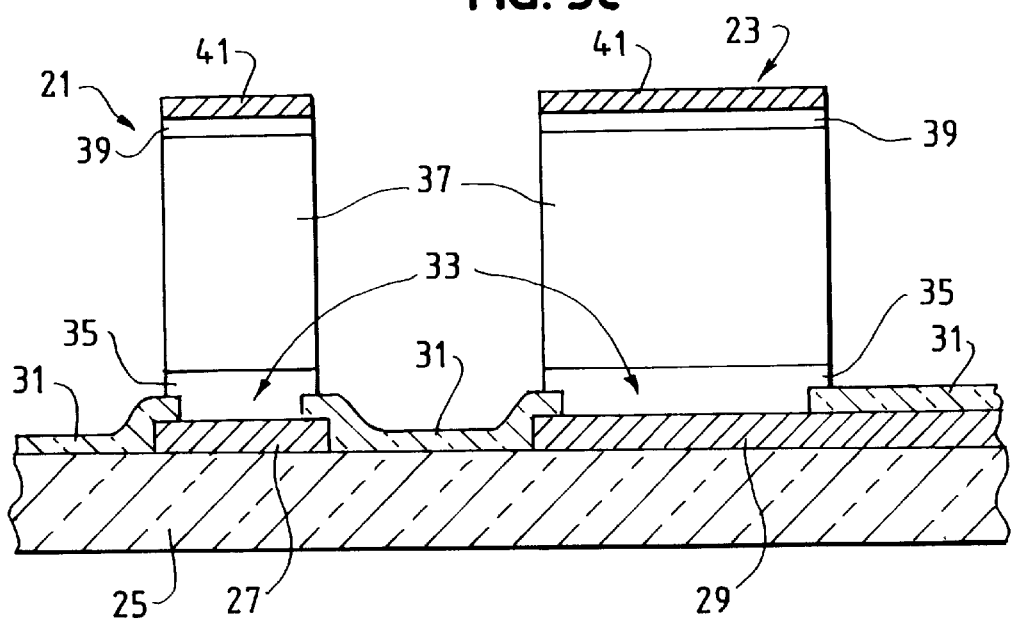
FIG. 3(c) is a side cross sectional view of a pair of PIN diodes formed according to the FIGS. 3(a)–3(c) process according to an embodiment of this invention, this figure illustrating both a switching PIN diode and a PIN photodiode.

FIGS. 3(a) to 3(c) illustrate a method of making an improved PIN diode structure according to an embodiment of this invention. It is noted that herein a "PIN" diode will be referred to as such regardless of whether the positive (p+) or negative (n+) layer is on the bottom of the intrinsic layer. A PIN diode is known to include a p+ layer (e.g. boron doped), an intrinsic layer, and a n+ layer (e.g. phosphorus doped), wherein the intrinsic layer is sandwiched between the p+ and n+ layers.

Referring first to FIG. 3(c), the structure includes switching PIN diode 21 and PIN photodiode 23 on substrate 25. When PIN photodiode 23 is provided, the PIN diode structure is useful in imagers, such as X-ray imagers where the photodiode allows a signal to be output that is indicative of the amount of light or X-rays received by the sensor in a given pixel. In the case of X-ray imaging, X-ray signals are converted into light signals by so called conversion materials such as CsI. However, even when photodiode 23 is not provided, arrays of switching PIN diodes 21 are useful in LCD addressing applications as well as other known imaging applications.

Each PIN diode structure 21 and 23 shown in FIG. 3(c) includes substantially transparent substrate 25 upon which are provided bottom PIN diode electrodes 27 and 29 (e.g. of Mo, Cr, Ta, Ti, or the like), passivating or insulating layer 31 (e.g. of silicon nitride, silicon oxide, an acrylic such as FujiClear, BCB, a polyimide, or the like) in which contact holes or vias 33 are formed where the PIN diodes are to be located, negative (n+) a—Si (amorphous silicon) layer 35, intrinsic (i) a—Si layer 37, positive (p+) a—Si layer 39, and overlying top electrode layer 41 (e.g. formed of ITO or some other transparent conductor). After the FIG. 3(c) structure is formed, the entire structure may be covered with a passivation layer such as silicon nitride, silicon oxide, a polyimide, an acrylic, FujiClear, BCB, or the like in order to provided a good base onto which other imager materials or LCD materials may be deposited or otherwise provided.

With regard to materials, the PIN layers are preferably of a—Si, with the n+ layer 35 being doped with an impurity such as phosphorous and the p+ layer 39 being doped with an impurity such as boron. However, it will be appreciated by those of skill in the art that other dopants and alternative PIN materials may also be used as desired. Likewise, the preferred electrode layers 27 and 41 are made of Mo and ITO, respectively, although others may instead be used in alternative embodiments.

Insulation layer 31 is preferably of silicon nitride according to certain embodiments of this invention. However, layer 31 may in certain alternative embodiments be formed of silicon oxide, suitable polyimides, suitable acrylics, materials such as BCB, materials such as FujiClear™, or the like. For example, materials described as insulating materials in any of U.S. Pat. Nos. 5,641,974 and 5,003,356 (disclosures of which are hereby incorporated herein by reference) may be used instead of silicon nitride, although the silicon nitride is currently preferable to applicant.

The provision of insulating and/or passivating layer 31 on substrate 25 over the bottom electrode layer 27, 29 provides the following advantages to PIN diode structures according to embodiments of this invention: (i) low leakage PIN diodes are provided; (ii) a wider range of materials may be selected and used for bottom electrode layer 27, including Mo, Ta, Ti, and the like; (iii) because Cr does not have to be used for the bottom electrode 27, the need for a Cr target installation and Cr etching development in wet bench is eliminated; (iv) RIE chamber contamination is reduced thereby substantially reducing downtime of the manufacturing system; (v) the need for post RIE treatment processing is substantially reduced or eliminated; and (vi) better crossover yields result since two silicon nitride layers are deposited between the bottom and top electrodes.

The FIG. 3(c) structure illustrates n+ layer 35 on the bottom and p+ layer 39 on top so that n+ layer 35 is positioned at some point between bottom electrode 27 and intrinsic layer 37 in each PIN diode. This is preferable in certain embodiments. However, it is recognized that n+ layer 35 and p+ layer 39 may swap positions so that in alternative embodiments, the p+ layer is located between the bottom electrode and the intrinsic layer.

Referring now to FIGS. 3(a) to 3(c) it will be described how the FIG. 3(c) PIN diode structure is manufactured according to certain embodiments of this invention. Substantially transparent substrate 25 is provided. Substrate 25 may be of glass, plastic, or the like.

Next, a substantially continuous bottom electrode layer (which results in electrodes 27 and 29) is deposited or otherwise provided on substrate 25. This continuous conductive electrode layer is preferably deposited to a thickness on the substrate's surface of from 1,000 to 8,000 Å, preferably about 5,000 Å. In certain preferred embodiments, this bottom electrode layer may be of, or include, Mo, but in alternative embodiments may be of Ti, Ta, Cr, or the like (so long as the material meets resistance requirements). This bottom electrode layer may be deposited by way of sputtering or vapor deposition.

The structure including substrate 25 and the continuous bottom electrode layer is then patterned by photolithography or the like to the desired bottom electrode and address line configuration. The upper surface of the bottom electrode metal is exposed in a window where the photoresist has not been retained. The continuous bottom electrode metal is either dry etched or wet etched (preferably using RIE) in order to pattern the bottom electrode metal in accordance with the retained photoresist pattern. In the case of dry etching, the structure is mounted in a known reactive ion etching (RIE) apparatus which is then purged and evacuated in accordance with known RIE procedures and etchants. This etching of the bottom electrode metal is preferably carried out until the bottom electrode metal is removed in center areas of the resist windows and is then permitted to proceed for an additional time (e.g. 10 to 40 seconds) of overetching to ensure that the electrode metal is entirely removed from within the windows. After the photoresist is removed the resulting structure is illustrated in FIG. 3(a), with bottom electrodes 27 and 29 having been patterned and formed. In the case of wet etching, mixtures of acid solutions are typically used to etch metals such as Mo, Cr, etc. It is noted that this patterning may also pattern the bottom electrode metal so that the resulting metal or conductor after etching forms both the PIN diode bottom electrodes and address lines in either the x or y direction.

After the FIG. 3(a) structure has been formed, a substantially continuous insulating or dielectric layer (which results in patterned layer 31) is deposited over the bottom electrode metal 27, 29 on substrate 25. This layer is deposited over substantially the entire surface of substrate 25 and over all areas covered by metal 27, 29, preferably by plasma enhanced chemical vapor deposition (CVD) or some other process known to produce a high integrity dielectric. This insulating or dielectric layer is deposited to a thickness on the substrate of from about 1,000 to 3,000 Å, preferably about 2,000 Å. This layer is of silicon nitride in certain embodiments. Preferably, this insulating layer is substantially transparent to visible light and has a dielectric constant less than about 8.0.

After the continuous insulating layer (which results in layer 31) has been deposited on substrate 25, through holes (i.e. contact holes or vias) 33 are formed in the continuous insulating layer at locations where the PIN diodes are to be positioned on the substrate. In preferred embodiments, contact holes 33 are formed in the insulating layer by dry or wet etching, although in alternative embodiments the contact holes may be photo-imaged into the layer when the insulating layer is formed of a photo-imageable material such as FujiClear (available from Fuji). When the holes 33 are etched into the insulating layer, a photoresist is applied over the top of the continuous insulating layer and is patterned so as to expose the insulating layer in areas to be removed during etching. After the contact holes or vias 33 have been formed or defined in the insulating layer 31, the resulting structure is shown in FIG. 3(b). Thus, FIG. 3(b) illustrates the structure after vias 33 have been formed, with only the bottom electrode 27, 29 areas beneath contact holes 33 being exposed, and all other areas of electrode metal 27, 29 being covered with the insulating layer 31.

After the FIG. 3(b) structure has been formed, continuous (i) n+ semiconductor, (ii) intrinsic semiconductor, (iii) p+ semiconductor, and (iv) top electrode layers (which result in layers 35, 37, 39, and 41) are successively deposited or otherwise provided on the FIG. 3(b) structure. In certain embodiments, these three semiconductor layers may be deposited via plasma enhanced CVD. Contact holes or via 33 allow the bottom PIN semiconductor layer (e.g. the n+ layer) to contact the top surface of the bottom PIN diode electrode 27, 29. The three PIN layers are preferably of a—Si in certain embodiments of this invention, and are deposited to the following thicknesses in preferred embodiments: n+ layer from about 200 to 1,000 Å, intrinsic layer from about 5,000 to 15,000 Å, and p+ layer from about 30 to 200 Å. The preferred thickness of the intrinsic layer is about 10,000 angstroms, while the preferred thickness of the n+ layer is about 500 angstroms, and the preferred thickness of the p+ layer is about 100 angstroms. After the three continuous PIN semiconductor layers have been deposited, the continuous top electrode layer (which results in electrodes 41) is deposited over the top semiconductor layer. This top electrode layer is preferably substantially transparent ITO in certain embodiments of this invention, at a thickness of from about 500 to 3,000 Å.

After these four continuous layers have been formed (the PIN layers and the top electrode layer), the top electrode layer is patterned using a photoresist and thereafter the top electrode layer (e.g. ITO) is etched to form the intended array of top electrodes for the PIN diodes. The etch process of ITO uses, e.g., HBr or HCl/HN solutions. The result an array of top electrodes 41.

After the top electrodes 41 have been patterned and formed, the three a—Si PIN layers are dry etched (RIE) in either $Cl_2$ or F based plasma. $Cl_2$ plasma is used in dry etching the a—Si PIN layers for two reasons: (a) $Cl_2$ etch could result in a low diode leakage current; and (b) $Cl_2$ plasma is very selective to silicon nitride (selectivity>10). While this plasma is preferred, it will be recognized that this invention encompasses other plasma types which may be utilized in alternative embodiments of this invention. Still further, because all metals (including bottom metal electrodes 27, 29) are covered by either the insulating layer 31 or by PIN materials, contamination of the RIE chamber is substantially reduced. After the PIN layers have been etched using RIE, the resulting structure is shown in FIG. 3(c), which includes switching PIN diode 21 and PIN photodiode 23 on substrate 25. A post etch treatment is often used in either plasma or in chemical solution.

After the FIG. 3(c) structure is formed, the top surface of the structure may be covered and planarized with another insulating layer of silicon nitride, silicon oxide, FujiClear, BCB, or the like as discussed in U.S. Pat. No. 5,641,974, so that thereafter additional LCD or imaging materials may be provided on the structure.

Figure 4:
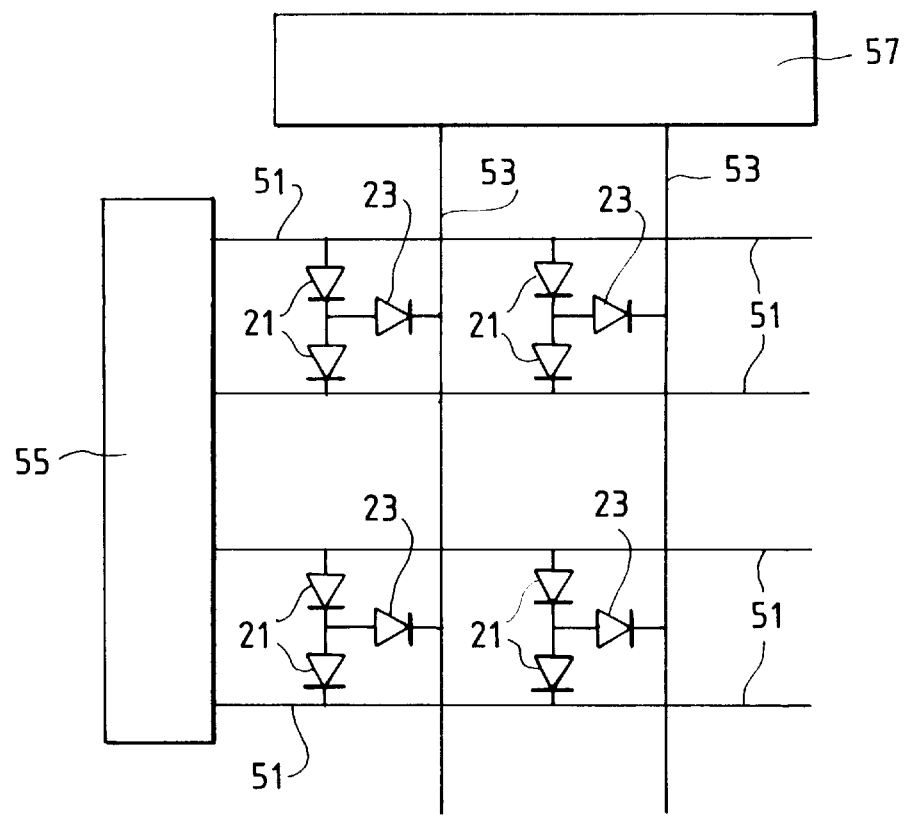
FIG. 4 is a schematic of a plurality of the FIG. 3 PIN diodes used in a solid state imager.
Figure 5:
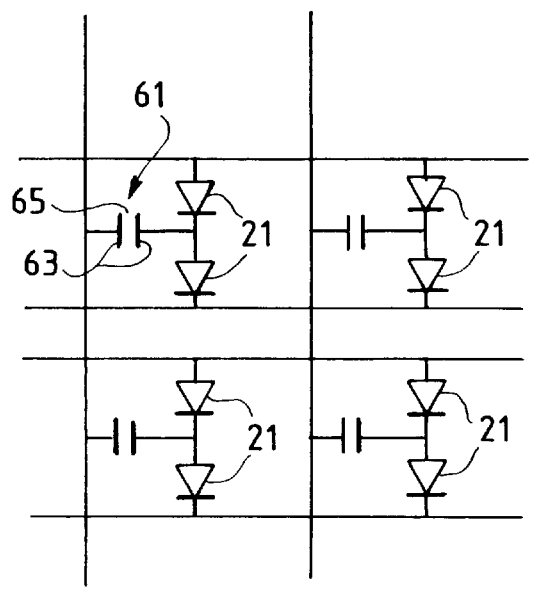
FIG. 5 is a schematic of a plurality of the FIG. 3 switching PIN diodes used in a liquid crystal display in order to selectively address individual pixel electrodes (and thus pixels) in the display.

FIG. 4 illustrates an array (or a plurality) of the FIG. 3 PIN diodes in a solid state image sensor, while FIG. 5 illustrates an array of the FIG. 3 PIN diodes in a liquid crystal display. As can be appreciated, for each of these applications, an array of bottom electrodes, an array of contact holes 33, an array of diode top electrodes, and an array of patterned PIN semiconductor layers must be formed on a substrate in order to effect the application desired.

As shown in FIG. 4, the photosensitive imager (e.g. X-ray imager) includes row address lines 51 for addressing switching PIN diodes 21 and column address lines 53 for addressing the PIN photodiodes 23. Four separate pixels are shown in FIG. 4. Also included are row select driver 55 and amplifier circuit 57. This circuitry is described, as is its operation, in U.S. Pat. No. 4,728,802, the disclosure of which is hereby incorporated herein by reference.

As shown in FIG. 5, switching diodes 21 may also be used to address a pixel 61 of a liquid crystal display. The LCD has an array of pixels, each pixel 61 including a pair of pixel electrodes 63 between which a liquid crystal layer 65 is sandwiched. Each pixel electrode 63 in a pixel is mounted on a different substrate as discussed in U.S. Pat. No. 5,641,974. In LCDs, of course, there is not need for photodiodes.

Once given the above disclosure, many other features, modifications, and improvements will become apparent to the skilled artisan. Such other features, modifications, and improvements are, therefore, considered to be a part of this invention, the scope of which is to be determined by the following claims.

I claim:

1. A method of making a PIN diode structure, the method comprising the steps of:
   providing a substrate;
   providing a bottom electrode on the substrate;
   depositing a substantially continuous insulation layer over the bottom electrode;
   forming a contact hole in the substantially continuous insulation layer at a location where a PIN diode is to be formed;
   depositing a n+ doped semiconductor layer, an intrinsic semiconductor layer, and a p+ doped semiconductor layer on the substrate over the bottom electrode and over a portion of the insulation layer so that one of (i) the n+ doped semiconductor layer, and (ii) the p+ doped semiconductor layer contacts the bottom electrode through the contact hole;
   providing a top electrode layer on the substrate over the p+ doped, n+ doped, and intrinsic semiconductor layers;
   patterning the top electrode layer to form a top electrode for the PIN diode; and
   etching each of the n+ doped semiconductor layer, the p+ doped semiconductor layer, and the intrinsic semiconductor layer in order to form the PIN diode at the location on the substrate where the contact hole was formed in the insulation layer.

2. The method of claim 1, wherein said semiconductor layers are deposited on the substrate in the following order: (1) n+ doped semiconductor layer, (2) intrinsic semiconductor layer, and (3) p+ doped semiconductor layer, so that the n+ doped semiconductor layer contacts the bottom electrode through the contact hole; and
   wherein each of the n+ doped semiconductor layer, the p+ doped semiconductor layer, and the intrinsic semiconductor layer include amorphous silicon (a—Si).

3. The method of claim 1, wherein the bottom electrode is formed of a metal including one of: Mo, Ta, and Ti.

4. The method of claim 1, wherein said insulation layer is from about 1,500 to 3,000 Å thick.

5. The method of claim 1, further comprising the step of forming the contact hole in the insulation layer so that the insulation layer, after said forming of the contact hole, overlaps at least one edge of the bottom electrode.

6. The method of claim 5, wherein said forming step is conducted so that the insulation layer, after said forming of the contact hole, overlaps a peripheral portion of the bottom electrode.

7. The method of claim 1, wherein said etching step includes dry etching the n+ doped, p+ doped, and intrinsic semiconductor layers via plasma enhanced reactive ion etching.

8. The method of claim 7, wherein said etching step includes using $Cl_2$ inclusive plasma.

9. The method of claim 7, wherein said insulation layer is substantially transparent to visible wavelengths of light and has a dielectric constant value of less than about 8.0.

10. The method of claim 7, wherein said insulation layer includes one of silicon nitride, silicon nitride, benzocyclobutene (BCB), an acrylic, and a polyimide.

11. The method of claim 10, wherein said insulation layer is photo-imageable.

12. The method of claim 10, wherein said insulation layer includes a substantial amount of silicon nitride.

13. A method of making an X-ray imager including switching PIN (p+ -intrinsic- n+) diodes and PIN photodiodes, the method comprising the steps of:
   providing a substrate;
   forming an array of first electrodes on the substrate;
   depositing a substantially continuous insulation layer over the array of first electrodes on the substrate;
   forming an array of contact holes or vias in the insulation layer, each contact hole being formed at a diode areas where a PIN diode is to be formed, each of the contact holes exposing a portion of a first electrode;
   after the array of contact holes or vias have been formed in the insulation layer, depositing each of a p+ doped a—Si (amorphous silicon) semiconductor layer, an intrinsic a—Si semiconductor layer, and a n+ doped a—Si semiconductor layer on the substrate so that the intrinsic a—Si layer is sandwiched between the n+ doped a—Si layer and the p+ doped a—Si layer, and wherein one of the p+ doped a—Si layer and the n+ doped a—Si layer is deposited over the insulation layer so as to contact the first electrodes through the contact holes;
   forming an array of top electrodes so that the intrinsic a—Si layer is located between one of the top electrodes and one of the first electrodes in the diode areas where PIN diodes are to be formed; and
   etching each of the p+ doped a—Si layer, the n+ doped a—Si layer, and the intrinsic a—Si layer in at least one etching chamber in order to form an array of PIN diodes on the substrate, each of the PIN diodes being located in one of the diode areas;
   wherein a first group of said PIN diodes are switching diodes and a second group of said PIN diodes are photodiodes; and
   making the X-ray imager so that each of the first electrodes is substantially entirely covered by (i) the insulation layer, and (ii) one of the p+ doped a—Si layer and the n+ doped a—Si layer in order to minimize contamination in the etching chamber.

14. The method of claim 13, wherein the insulation layer is substantially transparent to visible wavelengths of light and has a dielectric constant less than about 8.0.

15. The method of claim 14, further comprising performing said etching of the semiconductor layers in $Cl_2$ plasma.

16. The method of claim 15, wherein the insulation layer is of silicon nitride.

17. A method of making a liquid crystal display (LCD) including a plurality of diodes for selectively addressing individual pixels in the display, the method comprising the steps of:

providing a first substantially transparent substrate;

providing an array of bottom diode electrodes on the first substantially transparent substrate;

forming a substantially transparent insulation layer on the first substrate over the array of bottom diode electrodes, the insulation layer having a dielectric constant less than about 8.0;

forming an array of contact holes in the insulation layer at a corresponding plurality of diode areas, so that each of the contact holes exposes a corresponding one of the bottom diode electrodes in one of the diode areas;

after the array of contact holes have been formed in the insulation layer, forming a p+ doped semiconductor layer, a n+ doped semiconductor layer, and an intrinsic semiconductor layer on the substrate over the contact holes and over the insulation layer so that one of the p+ doped semiconductor layer and the n+ doped semiconductor layer contacts bottom diode electrodes through the contact holes;

forming an array of top diode electrodes so that in each of the diode areas the intrinsic semiconductor layer is positioned between a top diode electrode and a bottom diode electrode; and patterning the p+ doped semiconductor layer, the n+doped semiconductor layer, and the intrinsic semiconductor layer so as to form an array of diodes, each of the diodes being located in one of the diode areas.

18. The method of claim 17, further comprising the steps of:

providing a second substrate;

providing a plurality of pixel electrodes on the first substrate, each of the pixel electrodes being in communication-with at least one of the diodes so that diodes can selectively address pixel electrodes thereby enabling selective image data to be displayed to a viewer of the display;

sandwiching a liquid crystal layer between the first and second substrates; and wherein each of the p+ doped semiconductor layer, the n+ doped semiconductor layer, and the intrinsic semiconductor layer include amorphous silicon.

19. The method of claim 17, wherein said step of forming the array of contact holes in the insulation layer is performed in a manner so that each of (i) a lateral edge or side of each bottom electrode, and (ii) a top portion of each bottom electrode, is in contact with and covered by a portion of the insulation layer after the contact holes are formed.

* * * * *